United States Patent
Djordevic

(10) Patent No.: US 7,405,993 B2
(45) Date of Patent: Jul. 29, 2008

(54) CONTROL COMPONENT FOR CONTROLLING A SEMICONDUCTOR MEMORY COMPONENT IN A SEMICONDUCTOR MEMORY MODULE

(75) Inventor: Srdjan Djordevic, München (DE)

(73) Assignee: Qimonda AG, Munich (DE)

( * ) Notice: Subject to any disclaimer, the term of this patent is extended or adjusted under 35 U.S.C. 154(b) by 87 days.

(21) Appl. No.: 11/589,984

(22) Filed: Oct. 31, 2006

(65) Prior Publication Data

US 2008/0080292 A1 Apr. 3, 2008

(30) Foreign Application Priority Data

Sep. 18, 2006 (DE) .................. 10 2006 043 668

(51) Int. Cl.
*G11C 8/00* (2006.01)
(52) U.S. Cl. ................. 365/230.03; 365/52; 365/230.02
(58) Field of Classification Search ............ 365/230.03, 365/52, 230.02
See application file for complete search history.

(56) References Cited

U.S. PATENT DOCUMENTS 6,128,245 A * 10/2000 Seguchi .................. 365/23.03
6,667,905 B2 12/2003 Dono et al.

\* cited by examiner

*Primary Examiner*—Huan Hoang
(74) *Attorney, Agent, or Firm*—Edell, Shapiro & Finnan, LLC

(57) ABSTRACT

A semiconductor memory module includes a control component connected via various buses to semiconductor memory components on the top and bottom of a module board. Depending on the storage capacity and the rank configuration of the semiconductor memory module, address terminals are actuated via selection circuits either with address signals or control signals. According to an embodiment of the control component, control terminals are actuated with different control signals. The multiplexing of address and control signals allows the control component to control semiconductor memory components, in a semiconductor memory module, with different memory configurations without requiring an increased number of control terminals.

19 Claims, 8 Drawing Sheets

CONTROL COMPONENT FOR CONTROLLING A SEMICONDUCTOR MEMORY COMPONENT IN A SEMICONDUCTOR MEMORY MODULE

CROSS REFERENCE TO RELATED APPLICATIONS

This application claims priority under 35 U.S.C. §119 to Application No. DE 102006043668.7 filed on Sep. 18, 2006, entitled "Control Component for Controlling a Semiconductor Memory Component in a Semiconductor Memory Module," the entire contents of which are hereby incorporated by reference.

BACKGROUND

In the case of a semiconductor memory module, a module board includes a plurality of semiconductor memory components which communicate with the memory module's environment via a control component. FIG. 1 shows a module board MP on which a control component SB is arranged. The control component SB is situated at a central position on a top of the module board. On left-hand and right-hand sides of the control component, semiconductor memory components HB are arranged on the top of the module board and further semiconductor memory components HB arranged on the bottom of the module board. The semiconductor memory components are connected to the control component via various buses for transmitting clock, control, address and data signals. To this end, the control component comprises a number of clock, control, address and data terminals.

Each of the semiconductor memory components HB includes one or more memory chips C. FIG. 2A shows a semiconductor memory component HB in which four memory chips C are situated in a stack arrangement. Each of the memory chips comprises a memory cell array containing a multiplicity of memory cells. FIG. 2B shows a memory chip comprising a memory cell array in an enlarged illustration. The memory cells are arranged along word lines WL for activating one of the memory cells and bit lines BL for writing a memory state to one of the memory cells or for reading a memory state from one of the memory cells.

In the case of DRAM (Dynamic Random Access Memory) memory cells, a memory cell comprises a selection transistor AT and a storage capacitor SC. The storage capacitor SC can be conductively connected to the bit line BL via an appropriate control signal on the word line WL for the purpose of memory access. To improve the signal integrity for write access, a terminating resistor (On-Die Termination Resistor) ODTW, which is used to terminate a data bus for transmitting the data from the memory chip, is activated on the memory chip.

To activate the terminating resistor, the control component SB actuates the relevant semiconductor memory component or the memory chip of the memory component via a control signal ODTS (On-Die Termination Signal). In addition, the semiconductor memory components are actuated in order to select one of the memory chips of the memory component via a control signal CS (Chip Select Signal). Address signals are produced on address terminals of the control component SB and are supplied to the memory chips via address buses in order to select one of the memory cells in the memory cell array for memory access.

In the case of a memory module with the module configuration 2Rx4, a semiconductor memory module holds a total of 36 memory chips. A rank indicates the number of memory components necessary to provide the bus width for the control component. Since the bus width generally comprises 72 bits, an x4 organizational form for the semiconductor memory comprises 18 memory chips associated with a rank. If the semiconductor memory module in FIG. 1 is operated in a configuration of 2Rx4, each of the semiconductor memory components comprises two memory chips, therefore a total of 36 memory chips are situated on the module board.

Since particularly the control components SB have a high power consumption, great efforts are made to reduce the number of semiconductor memory modules required for implementing a memory with a certain capacity. With a semiconductor memory module in the 4Rx4 module configuration comprising semiconductor memory components that each include two stacked memory chips with a storage density of 1 Gbit, a storage capacity of 8 GB can be produced, for example, while only a storage capacity of 4 GB can be achieved with a semiconductor memory module in the module configuration 2Rx4, which contains semiconductor memory components that each include two stacked memory chips with a storage density of 1 Gbit. Therefore, the power consumption in a memory can be reduced by approximately half if, instead of using memory modules in the 2Rx4 configuration, memory modules in the 4Rx4 configuration are used. In this case, only 8 memory modules in the 4Rx4 configuration are required to design a memory with a storage capacity of 64 GB, for example, whereas 16 semiconductor memory modules in the configuration 2Rx4 would be necessary to design a memory of this kind. Since the number of control components is thus also reduced by half, the use of 8 semiconductor memory modules in the 4Rx4 configuration also allows the power consumption to be reduced by half in comparison with the use of 16 memory modules in the 2Rx4 module configuration.

If the semiconductor memory module in FIG. 1 is designed in a module configuration of 4Rx4, the module board holds a total of 72 memory chips. As FIG. 2A shows, each of the semiconductor memory components respectively contains 4 memory chips in a stack arrangement. To control a semiconductor memory module of this kind, further control signals need to be produced by the control component SB in comparison with a semiconductor memory module in the 2Rx4 configuration. Thus, particularly for the purpose of actuating the two additional ranks, further control signals CS (Chip Select) are required for selecting the memory chips in the additional ranks and additional control signals ODTS are required for activating the terminating resistors for the memory chips in the additional ranks. However, the provision of additional output terminals for providing the additional control signals is associated with an increase in the chip size for the control component and with an increase in the power requirement for the control component.

SUMMARY

The invention relates to a control component for controlling a semiconductor memory component in a semiconductor memory module, where the control component is connected to semiconductor memory components in the semiconductor memory module via various buses for transmitting control and address signals. The invention also relates to a semiconductor memory module in which a control component is connected to semiconductor memory components via various buses for transmitting control and address signals. The invention also relates to a method for operating a semiconductor memory module of this kind.

A semiconductor memory module includes a control component connected via various buses to semiconductor memory components on the top and bottom of a module board. Depending on the storage capacity and the rank configuration of the semiconductor memory module, address terminals are actuated via selection circuits either with address signals or control signals. According to an embodiment of the control component, control terminals are actuated with different control signals. The multiplexing of address and control signals allows the control component to be operable for controlling semiconductor memory components in a semiconductor memory module with different memory configurations, e.g., 2Rx4, 4Rx4 and 4Rx8, without increasing the number of control terminals.

The above and still further features and advantages of the described device and method will become apparent upon consideration of the following definitions, descriptions and descriptive figures of specific embodiments thereof, wherein like reference numerals in the various figures are utilized to designate like components. While these descriptions go into specific details of the device and method, it should be understood that variations may and do exist and would be apparent to those skilled in the art based on the descriptions herein.

BRIEF DESCRIPTION OF THE DRAWINGS

The invention is explained in more detail below with reference to exemplary embodiments, where.

DETAILED DESCRIPTION

Figure 1:
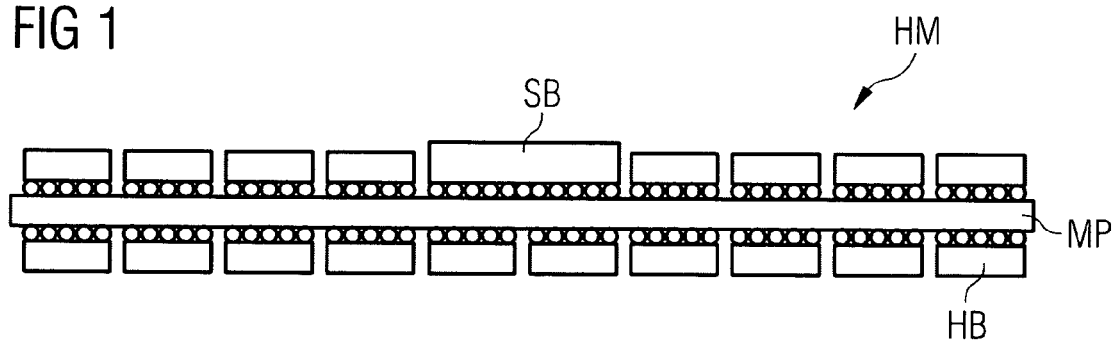
FIG. 1 shows an embodiment of a semiconductor memory module comprising a control component and semiconductor memory components.
Figure 2A:
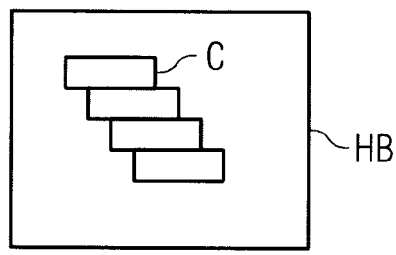
FIG. 2A shows an embodiment of a semiconductor memory component comprising memory chips.
Figure 2B:
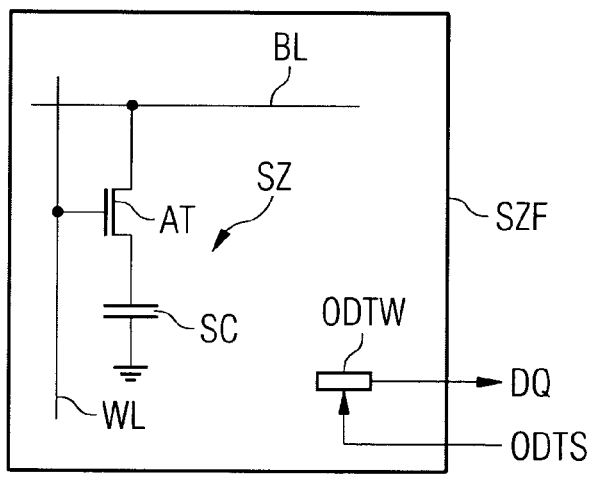
FIG. 2B shows an embodiment of a memory chip in a semiconductor memory component.

According to an embodiment of a control component for controlling a semiconductor memory component of a semiconductor memory module described herein, the number of control terminals for generating control signals for controlling the semiconductor memory component remains unchanged when the storage capacity of the semiconductor memory module is increased. According to an embodiment of a semiconductor memory module, the number of control terminals for generating control signals for controlling the semiconductor memory component remains unchanged when the storage capacity of the semiconductor memory module is increased. According to an embodiment of a method for operating a semiconductor memory module, the number of control terminals of a control component for controlling the semiconductor memory component of the semiconductor memory module remains unchanged when the storage capacity of the semiconductor memory module is increased.

According to an embodiment of a control component for controlling a semiconductor memory component in a semiconductor memory module, the control component includes a control unit for generating control signals for controlling read and write access to the semiconductor memory component and for generating address signals for addressing memory cells in a semiconductor memory component for read and write access. Furthermore, the control component includes a plurality of address terminals for providing the address signals. The control unit includes at least one selection circuit. The at least one selection circuit supplies the at least one of the address terminals with one of the address signals and with one of the control signals.

Depending on whether the semiconductor memory module is operated in a 2Rx4 configuration or in a 4Rx4 configuration, different signals can be mapped to an address terminal. This allows the control component to be used both in a semiconductor memory module in the 2Rx4 configuration and in a semiconductor memory module in the 4Rx4 configuration. Although to operate a semiconductor memory module in the 4Rx4 configuration it is necessary to have additional control signals, e.g., (Chip Select Signals), for selecting memory chips belonging to the two additional ranks and furthermore at least one further control signal, e.g., (On-Die Termination Signal), for activating the On-Die terminating resistors in the memory chips in the two additional ranks, the number of control outputs for mapping these signals of the control component is not increased. For example, a control component which was previously intended only for two-rank support can therefore also be used for a semiconductor memory module comprising four ranks.

According to an embodiment of a semiconductor memory module, the semiconductor memory module includes a control component based on the embodiment indicated above. The semiconductor memory module also comprises a plurality of semiconductor memory components. In addition, a module board is provided including the control component and the plurality of semiconductor memory components such that the plurality of semiconductor memory components are arranged on a left-hand and a right-hand side of the control component. A bus connects each of the address terminals of the control component to the semiconductor memory components. One of the buses, which is connected to the first of the address terminals, connects the semiconductor memory components on the left-hand and right-hand sides of the control component to the control component. The semiconductor memory components are preferably operated in a module configuration of 4Rx4 or 4Rx8.

A method for operating a semiconductor memory module is subsequently specified. In order to apply the method, a semiconductor memory module based on the embodiment specified above is provided. The semiconductor memory module is operated in a first configuration when the semiconductor memory module comprises a first number of ranks, and is operated in a second configuration when the semiconductor memory module comprises a second number of ranks. A first control signal for controlling read and write access to the semiconductor memory component is mapped to on a first address terminal of the control component in the semiconductor memory module when the semiconductor memory module is operated in the first configuration. A first address signal, a floating potential or a reference potential is mapped to a second address terminal when the semiconductor memory module is operated in the second configuration.

In the following paragraphs, exemplary embodiments of the device are described in connection with the figures.

Figure 3:
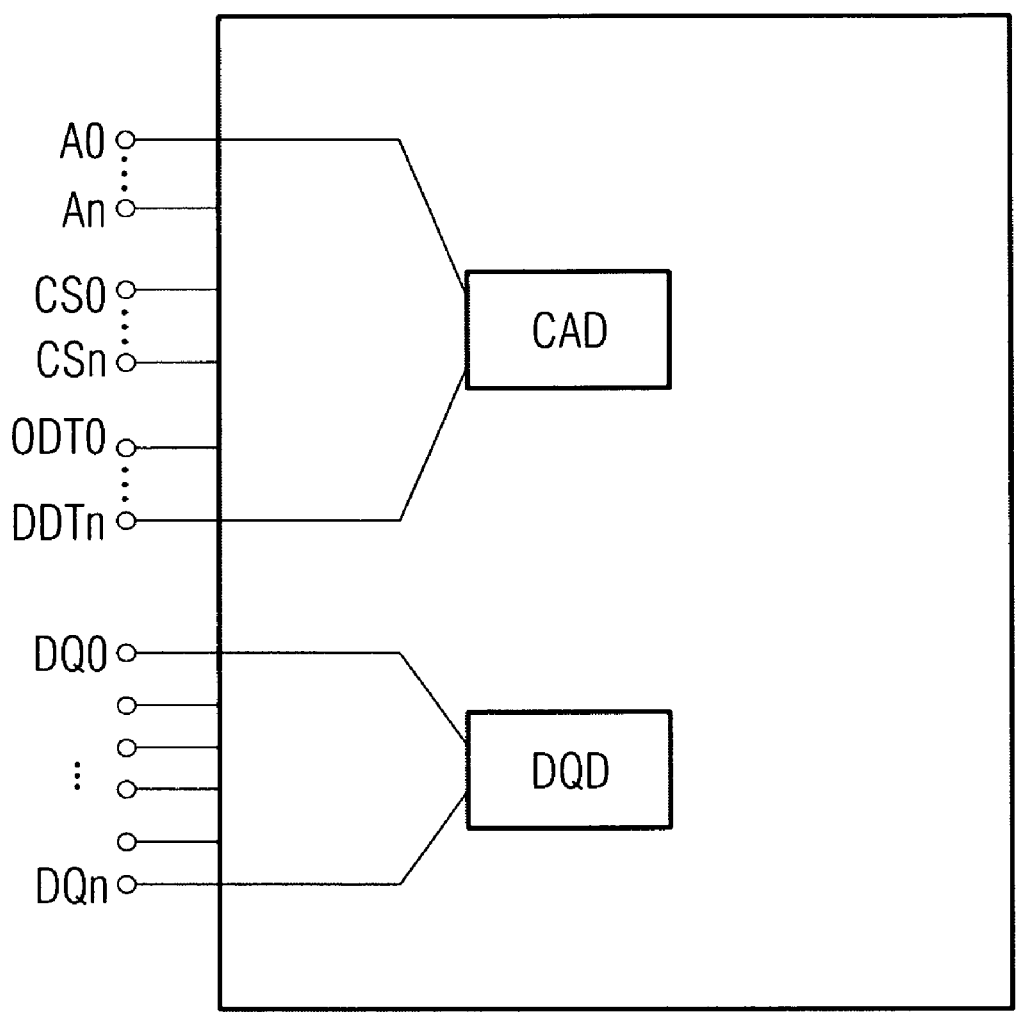
FIG. 3 shows an embodiment of a control component for controlling semiconductor memory components in a semiconductor memory module.

FIG. 3 shows an embodiment of a control component SB for controlling semiconductor memory components in a semiconductor memory module. The control component SB comprises an address control unit CAD for mapping control and address signals. The control unit CAD is connected to external terminals of the control component. The external terminals CS0, . . . , CSn can carry control signal SCS, e.g., for selecting memory chips arranged in stacked form in the semiconductor memory components. In addition, external terminals ODT0, . . . , ODTn connected to the control unit CAD can carry a respective control signal ODTS for activating a terminating resistor in the memory chips during write access. Address signals SA can be applied to address terminals A0, . . . An.

Furthermore, the control component SB comprises a data control unit DQD for controlling the generation and reception of data signals transmitted to and received from the semiconductor memory components. The data control unit DQD is connected to data terminals DQ0, . . . , DQn. In order to avoid crosstalk between the control and address signals and the data signals, the control units DQD and CAD are arranged in isolation.

Figure 4:
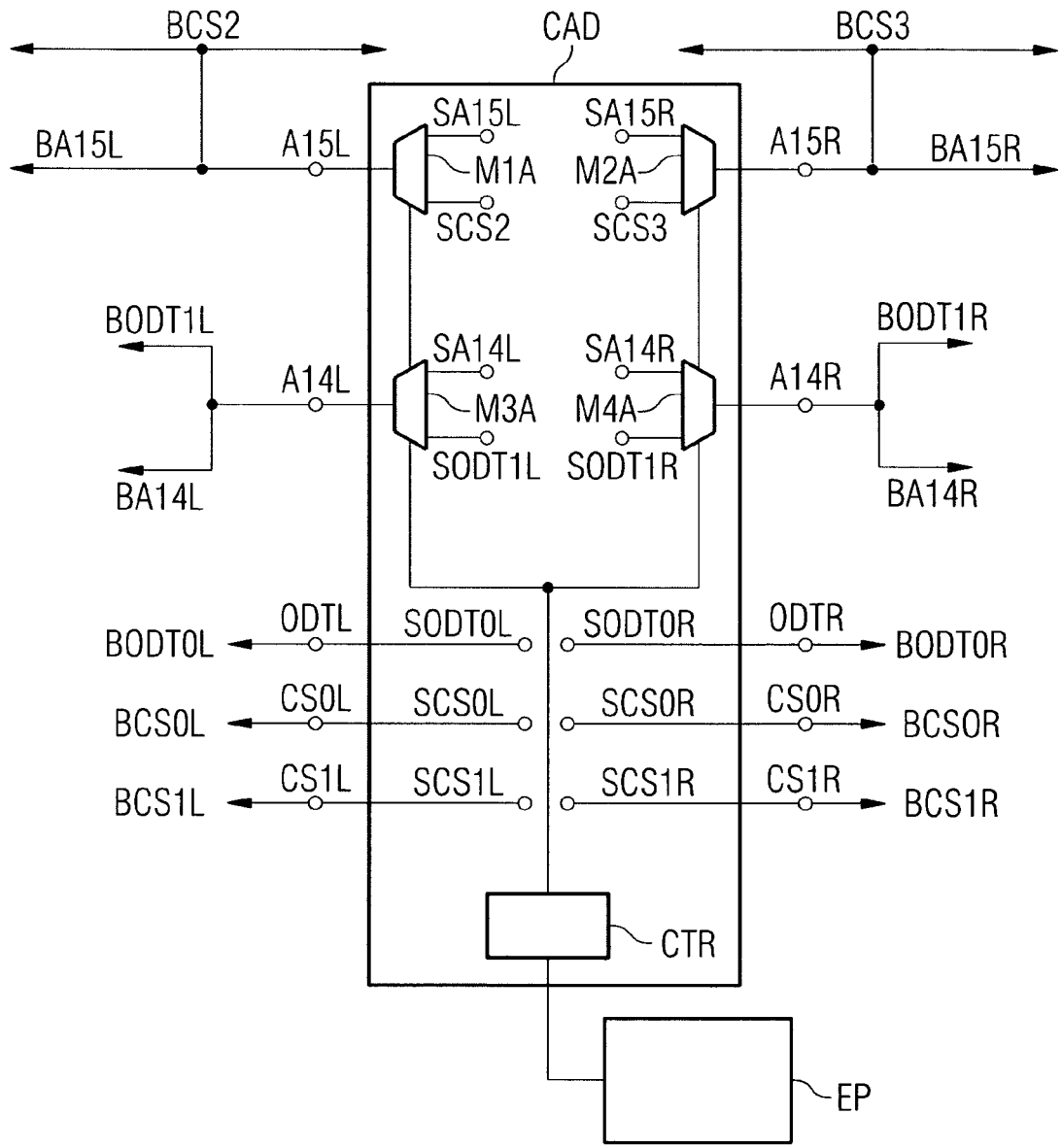
FIG. 4 shows a first embodiment of a control unit in a control component for controlling semiconductor memory components in a semiconductor memory module.

FIG. 4 shows an embodiment of an address control unit CAD of a control component for controlling a semiconductor memory module with memory chips with a storage density of 1 Gbit. The output side of the control unit maps various control signals applied to external terminals of the control component. The control component includes external address terminals A0L, . . . , A15L on the left-hand side and address terminals A0R, . . . , A15R on the right-hand side. In addition, the control component comprises external terminals CS0L, CS1L on the left-hand side and CS0R, CS1R on the right-hand side, which are able to map control signals for selecting the memory chips in rank 0 and in rank 1.

A control signal SCS0L for activating the memory chips in rank 0, arranged on the left-hand side of the module board, is supplied to a control terminal CS0L connected to a bus BCS0L. To select memory chips in rank 0, disposed on the right-hand side of the control component, a control signal SCS0R is generated and applied to a control terminal CS0R connected to a bus BCS0R on the right-hand side of the control component. To select memory chips associated with rank 1, a control terminal CS1L on the left-hand side generates a control signal SCS1L supplied via a bus BCS1L to the memory chips on the left-hand side of the module board. A control terminal CS1R on the right-hand side of the control component produces a control signal SCS1R supplied via a bus BCS1R to the semiconductor memory components disposed on the right-hand side of the control component.

To activate the terminating resistor for the memory chips in ranks 0 and 1, a control terminal ODTL on the left-hand side of the control component generates a control signal SODT0L supplied via a bus BODT0L to the memory chips in ranks 0 and 1 on the left-hand side of the control component. Similarly, a control terminal ODTR on the right-hand side of the control component generates a control signal SODT0R supplied via a bus BODT0R to the memory chips in ranks 0 and 1 on the right-hand side of the control component in order to activate the terminating resistor.

Selecting memory chips in ranks 2 and 3 requires mapping further control signals SCS2 and SCS3 via the control unit CAD. According to the described device, the control signal SCS2 for selecting memory chips in rank 2 and the control signal SCS3 for selecting memory chips in rank 3 are mapped and applied to an address terminal A15L and an address terminal A15R provided for the purpose of generating address signals SA15L and SA15R, for example, in the case of a semiconductor memory module including memory chips with a storage density of 1 Gbit, but which are not used.

The address terminal A15L can be mapped with the control signal SCS2 or with the address signal SA15L via a selection circuit M1A. The address terminal A15R can be mapped with the control signal SCS3 or with the address signal SA15R via a selection circuit M2A. When the address terminal A15L or the address terminal A15R is supplied with the control signal SA15L or SA15R, the output terminals A15L and A15R are connected to a bus BA15L, which is routed to the memory chips on the left-hand side of the module board, or are connected to a bus BA15R, which is routed to the memory chips on the right-hand side of the module board. When the address terminal A15L is supplied with the control signal SCS2, the address terminal A15L is connected to a bus BCS2 which supplies the control signal SCS2 for selecting the memory chips in rank 2 to the memory chips on the left-hand and right-hand sides of the control component. When the address terminal A15R is supplied with the control signal SCS3, the address terminal A15R is connected to a bus BSC3 which routes the control signal SCS3 for selecting memory chips in rank 3 to the memory chips on the left-hand and right-hand sides of the control component.

In the case of a semiconductor memory module including memory chips with a storage density of 1 Gbit, the address terminal A14L arranged on the left-hand side of the control component SB and the address terminal A14R arranged on the right-hand side of the control component are not used. According to the described device, these address terminals therefore are mapped with the control signals SODT1L and SODT1R for activating the terminating resistors for the memory chips in rank 2 and in rank 3. The address signal SA14L and the control signal SODT1 can be mapped via a selection circuit M3A to the address terminal A14L connected to an address bus BA14L for transmitting the address signal SA14L or a control bus BODT1L for transmitting the control signal SODT1L.

Similarly, the address terminal A14R on the right-hand side of the control component is connected to a selection circuit M4A. The selection circuit M4A can be used to map the address terminal A14R either with the address signal SA14R via a bus BA14R connected to the memory chips on the right-hand side of the control component, or with the control signal SODT1R. In the latter case, the address terminal A14R is connected to a control bus BOT1R for transmitting the control signal SODT1R to the memory chips in rank 2 and in rank 3 on the right-hand side of the control component.

The selection circuits, e.g., multiplexers, are controlled via a control circuit CTR. In one embodiment, the control circuit CTR reads a memory circuit EP arranged on the memory chip when the semiconductor memory module is activated. A memory state, stored in the memory circuit EP, identifies the operating configuration of the control component SB, e.g. a 2Rx4, a 4Rx4 or a 4Rx8 module configuration.

In the latter case, the selection circuits M1A, M2A, M3A and M4A are actuated such that the control signal SCS2 is selectively supplied, i.e., mapped, to the address terminal A15L, the control signal SCS3 is selectively supplied, i.e., mapped, to the address terminal A15R and the control signal SODT1L is mapped to the address terminal A14L, and the control signal SODT1R is mapped to the address terminal A14R. When the semiconductor memory module is being operated in a configuration with 2 ranks, the address signals SA14L, SA14R, SA15L and SA15R are instead mapped to the address terminals A14L, A14R, A15L, A15R. If these address signals are not used on account of the low storage capacity of the semiconductor memory module, a floating potential or a reference potential, e.g., a ground potential, is applied to the address terminals A14L, A14R, A15L and A15R.

Figure 5:
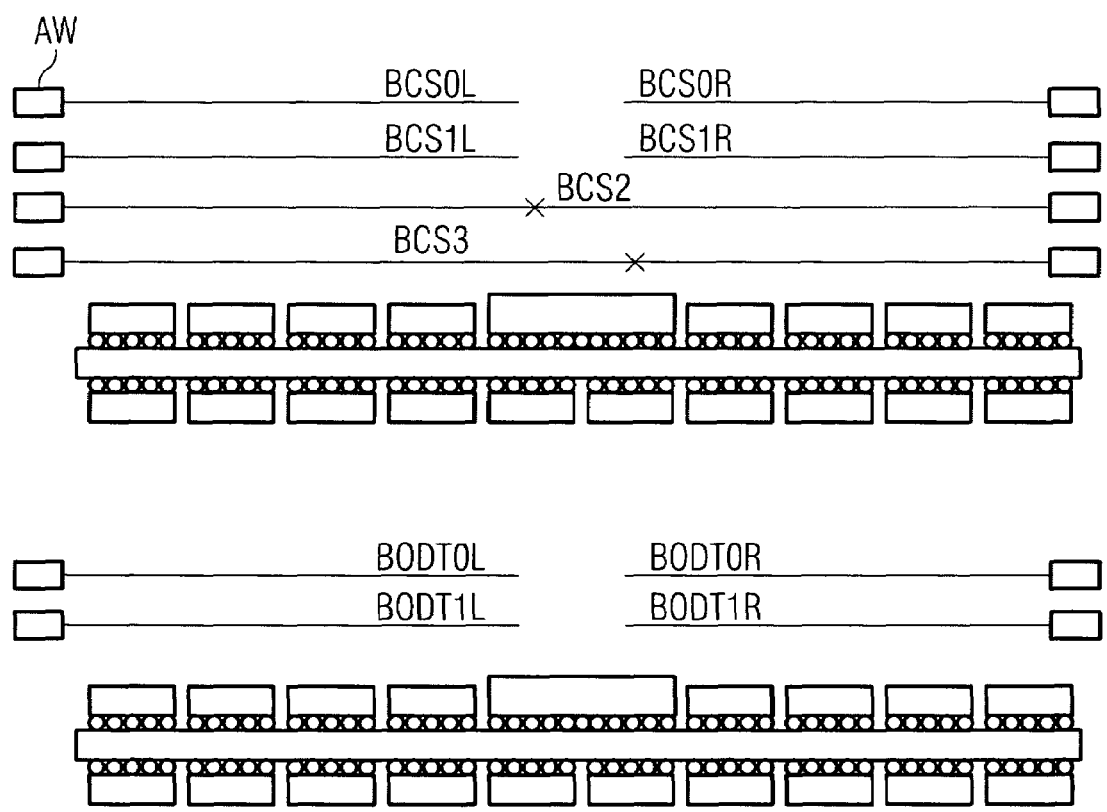
FIG. 5 shows a first arrangement of bus lines for transmitting control signals from a control component to semiconductor memory components of a semiconductor memory module.

FIG. 5 shows a first arrangement of bus lines for transmitting the control signals SCS for selecting memory chips in various ranks. The buses BCS0L and BCS1L run from the control component to the semiconductor memory components on the left-hand side of the control component and are terminated at their respective ends via a terminating resistor AW. The buses BCS0R and BCS1R run from the control component to semiconductor memory components situated on the right-hand side of the control component and are respectively terminated via a terminating resistor. The buses BCS2 and BCS3 run from the address terminals A15L and A15R of the control component to semiconductor memory components arranged on the left-hand and right-hand sides of the control component. The buses BCS2 and BCS3 are terminated at their two respective ends via a terminating resistor AW.

The buses BODT0L and BODT1L connect the semiconductor memory components on the left-hand side of the control component to the control component. The buses BODT0R and BODT1R are connected to the semiconductor memory components arranged on the right of the control component. All the buses BODT0L, BODT0R, BODT1L and BODT1R are respectively terminated via a terminating resistor.

Figure 6:
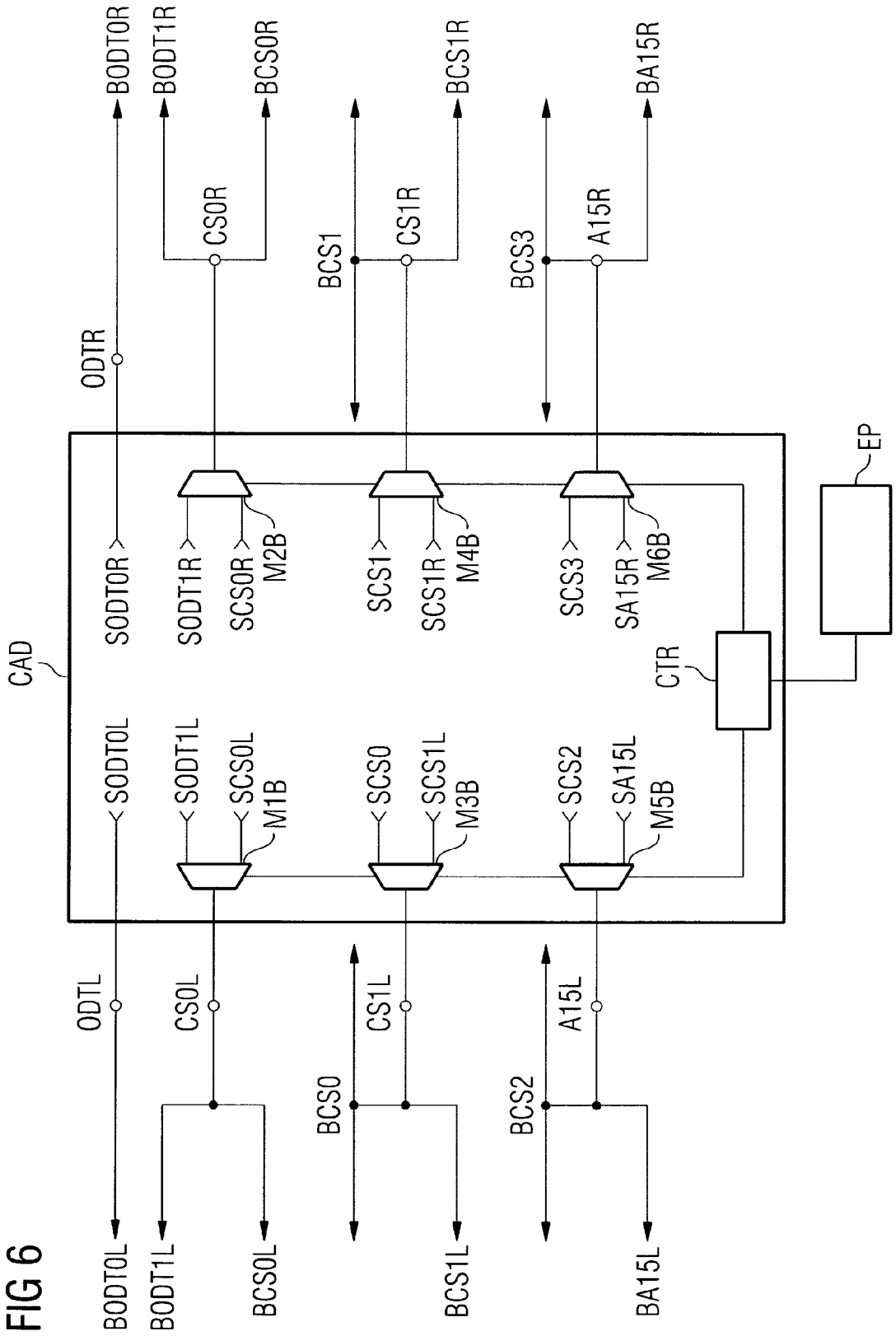
FIG. 6 shows a second embodiment of a control unit of a control component for controlling semiconductor memory components of a semiconductor memory module.

FIG. 6 shows an embodiment of an address control unit CAD in a control component for controlling a semiconductor memory module including memory chips with a storage density of 2 Gbit. Since the storage density is twice that of the embodiment in FIG. 4, the address terminals A14L, A14R, A15L and A15R are therefore not all available in the case of a memory module including memory chips with a storage density of 2 Gbit in the 4Rx4 or 4Rx8 configuration. In the case of a semiconductor memory module including memory chips with a storage density of 2 Gbit and the module configuration 4Rx4 or 4Rx8, only the address terminals A15L and A15R are unused.

According to the described device, selection circuits M1B, ..., M6B are connected to the control terminals CS0L, CS1L, CS0R and CS1R and to the two address terminals A15L and A15R, which can be used for selectively supplying, i.e., mapping, two different signals to the control and address terminals.

In similar fashion to the case of a semiconductor memory module in the 4Rx4 or 4Rx8 configuration, including memory chips with a storage capacity of 1 Gbit, a semiconductor memory module in the 4Rx4 or 4Rx8 configuration including memory chips with a storage capacity of 2 Gbit involves either the address signal SA15L or the control signal SCS2 for selecting the memory chips associated with rank 2 being selected on the address terminal A15L. When the address terminal A15L is supplied, i.e., mapped, with the address signal SA15L, the address terminal A15L is connected to a bus line BA15L for actuating the memory chips on the left-hand side of the control component with the address signal SA15L. When the address terminal A15L is supplied, i.e., mapped, with the control signal SCS2 during operation of the semiconductor memory module in the 4Rx4 memory configuration, the address terminal A15L is connected to a bus line BCS2 for supplying, i.e., mapping, the control signal SCS2 both to the memory chips on the left-hand side of the control component and to the memory chips on the right-hand side of the control component.

The address terminal A15R is mapped either with the address signal SA15R or with the control signal SCS3 for selecting the memory chips associated with the rank 3, depending on the memory configuration 2Rx4 or 4Rx4, or 4Rx8. In the first case, the address terminal A15R is connected to a bus BA15R for transmitting the address signal SA15R, the bus being connected to the memory chips on the right-hand side of the control component. In the second case, the address terminal A15R is connected to a bus BCS3, which maps the control signal SCS3 both to the memory chips on the left-hand side and to the memory chips on the right-hand side of the control component, which are associated with rank 3.

The control terminals CS1L and CS1R can be mapped, via the selection circuits M3B and M4B, either with the control signal SCS1L for selecting memory chips in rank 1, which are situated on the left-hand side of the control component, or with the control signal SCS0 for selecting memory chips in rank 0, which are situated both on the left-hand side and on the right-hand side of the control component. When the control terminal CS1L is supplied with the control signal SCS1L, the control terminal CS1L is connected to a bus BCS1L which supplies the control signal SCS1L to the memory chips in rank 1, which are situated on the left-hand side of the control component. When the semiconductor memory module is operated in the 4Rx4 or 4Rx8 configuration, the control signal SCS0, which can be used to select the memory chips in rank 0, is mapped to the control terminal CS1L. In this case, the control terminal CS1L is connected to a bus BCS0 which is connected to all the memory chips in rank 0 on the left-hand and right-hand sides of the control component.

When the semiconductor memory module is operated in the 2Rx4 configuration, the control terminal CS1R is mapped with the control signal SCS1R, which is supplied via the bus BCS1R to the memory chips, on the right-hand side of the control component, associated with rank 1. When the semiconductor memory module is operated in the 4Rx4 or 4Rx8 configuration, the control terminal CS1R is mapped with the control signal SCS1, which can be used to select all the memory chips in rank 1. In this case, the control terminal CS1R is connected to a bus BCS1 which is connected to all the semiconductor memory components in rank 1 on the left-hand and right-hand sides of the control component.

The control terminal CS0L, which, during operation of the semiconductor memory module in the 2Rx4 memory configuration, is mapped with the control signal SCS0L, which can be used to select the memory chips in rank 0 situated on the left-hand side of the control component. Control terminal CS0L is mapped with the control signal SODT1L via the selection circuit M1B when the semiconductor memory module is operated in the 4Rx4 or 4Rx8 configuration. The control signal SODT1L can be used to activate the terminating resistors for the memory chips in rank 2 and in rank 3, which are connected on the left-hand side of the control component. In this case, the control terminal CS0L is connected to a bus BODT1L which is connected to the memory chips in rank 0 and in rank 1 on the left-hand side of the control component.

When the control terminal CS0L is mapped with the control signal SCS0L via actuation of the selection circuit M1B, the control terminal CS0L is connected to a bus BCS0L, which is connected to the memory chips in rank 0 situated on the left-hand side of the control component.

The control terminal CS0R is mapped with the control signal SCS0R via the selection circuit M2B when the semiconductor memory module is operated in the 2Rx4 configuration. The control signal SCS0R, supplied via the bus BCS0R to the memory chips on the left-hand side of the control component, can be used to select the memory chips in rank 0 for read or write access. When the semiconductor memory module is operated in the 4Rx4 or 4Rx8 configuration, the control terminal CS0R is mapped with the control signal SODT1R via the selection circuit M2B. The control signal SODT1R can be used to activate the terminating resistors for the memory chips in rank 2 and in rank 3, which are situated on the right-hand side of the control component.

The control signals SODT0L and SODT0R for activating the terminating resistors for the memory chips associated with ranks 0 and 1 continue to be supplied to control terminals ODTL and ODTR connected to buses BODT0L and BODT0R respectively. The control terminals ODTL and ODTR are therefore provided exclusively for generating the ODT control signals. The bus BODT0L is used to forward the control signal SODT0L to the memory chips in rank 0 and in rank 1 arranged on the left-hand side of the control component. The bus BODT0R forwards the control signal SODT0R to all the semiconductor memory components in rank 0 and in rank 1 situated on the right-hand side of the control component.

The configuration type in which the semiconductor memory module is operated is stored in a memory circuit EP arranged on the module board MP. For example, the memory circuit EP may be an electrically programmable memory circuit (EPROM memory circuit). When the semiconductor memory module is activated, a control circuit CTR reads the memory state of the memory circuit EP. When the semiconductor memory module is operated in the 4Rx4 or 4Rx8 configuration, the selection circuits M1B, . . . , M6B are then controlled via the control circuit CTR such that the control signal SODT1L is selectively supplied, i.e., mapped, to the control terminal CS0L, the control signal SODT1R is mapped to the control terminal CS0R, the control signal SCS0 is mapped to the control terminal CS1L, the control signal SCS1 is mapped to the control terminal CS1R and the control signals SCS2 and SCS3 are mapped to the address terminals A15L and A15R.

When the semiconductor memory module including memory chips with a storage capacity of 2 Gbit is operated in the configuration type 2Rx4, the selection circuits M1B, M6B are actuated, following the reading of the memory state of the memory circuit EP via the control circuit CTR, such that the control signal SCS0L is selectively supplied, i.e., mapped, to the control terminal CS0L, the control signal SCS0R is mapped to the control terminal CS0R, the control signal SCS1L is mapped to the control terminal CS1L and the control signal SCS1R is mapped to the control terminal CS1R. In the case of a semiconductor memory module in the 2Rx4 configuration including memory chips with a storage capacity of 2 Gbit, the address signals SA15L and SA15R are not needed. In this case, the address terminals A15L and A15R are supplied with a floating potential or a ground potential. Such potentials can likewise be mapped to the address terminals, for example, via the selection circuits. If the storage capacity of the semiconductor memory module is increased in the 2Rx4 configuration type, the address signals SA15L and SA15R can be mapped to the address terminals A15L and A15R.

Figure 7:
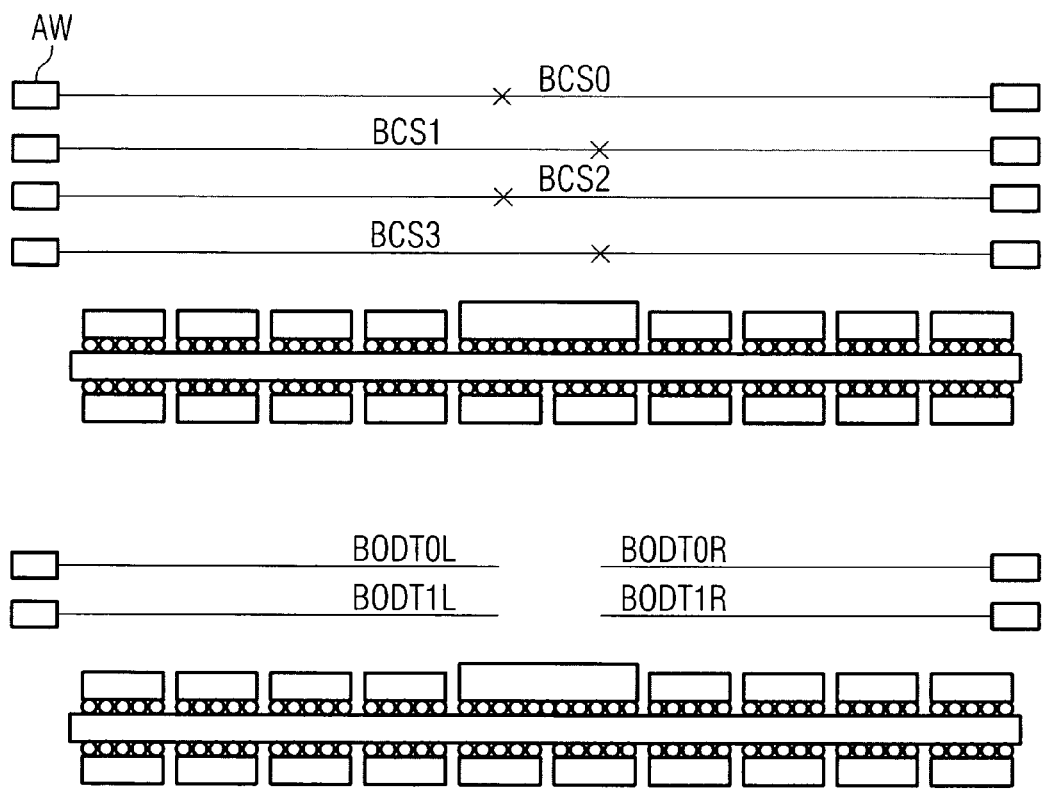
FIG. 7 shows a second arrangement of bus lines for transmitting control signals from a control component to semiconductor memory components of a semiconductor memory module.

FIG. 7 shows the bus lines for transmitting the control signals SCS and SODT to the semiconductor memory components arranged on the left and right of the control component. Starting from the control terminals CS1L, CS1R, A15L and A15R, the buses BCS0, BCS1, BCS2 and BCS3 respectively connect semiconductor memory components on the left-hand and right-hand sides of the control component. Each of the bus lines has its two ends terminated via a terminating resistor AW. In addition, FIG. 7 shows the course of the bus lines BODT0L, BODT0R, BODT1L and BODT1R, which corresponds to the course as described in FIG. 5.

Figure 8:
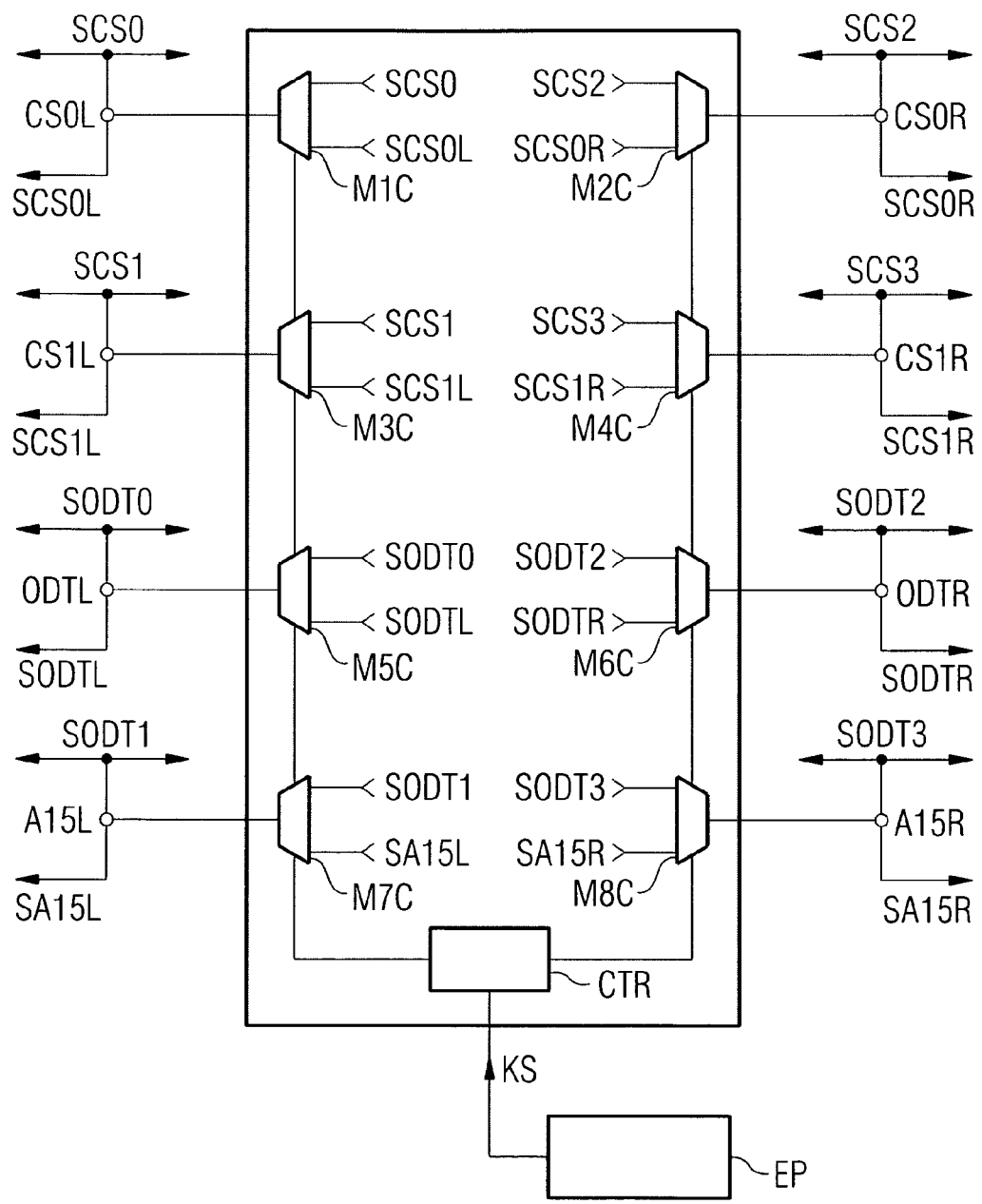
FIG. 8 shows a third embodiment of a control unit of a control component for controlling semiconductor memory components of a semiconductor memory module.

FIG. 8 shows another embodiment of a control component SB which produces control signals SCS for selecting memory chips in various ranks and control signals SODT for activating terminating resistors for the memory chips. In contrast to the embodiments shown in FIGS. 4 to 7, separate control signals SODT0, . . . , SODT3 for activating the respective terminating resistors are produced for each rank. The control terminals CS0L, CS0R, CS1L, CS1R, ODTL, ODTR, A15L and A15R are respectively connected to selection circuits M1C, . . . , M8C, on which various signals can be selectively supplied, i.e., mapped, to the control and address terminals on the basis of whether the semiconductor memory module is operated in a configuration 2Rx4 or 4Rx4, or 4Rx8.

When the semiconductor memory module is operated in a 2Rx4 configuration, the selection circuits M1C, . . . , M8C, which are in the form of multiplexer circuits, for example, are connected such that the control signal SCS0L is selectively supplied, i.e., mapped, to the control terminal CS0L, the control signal SCS0R is mapped to the control terminal CS0R, the control signal SCS1L is mapped to the control terminal CS1L, the control signal SCS1R is mapped to the control terminal CS1R, the control signal SODTL is mapped to the control terminal ODTL, the control signal SODTR is mapped to the control terminal ODTR and the address signals SA15L and SA15R are mapped to the control terminals A15L and A15R.

When the semiconductor memory module is operated in a 4Rx4 or 4Rx8 configuration, the multiplexer circuits M1C, . . . , M8C are connected such that the control signal SCS0 is selectively supplied, i.e., mapped, to the control terminal CS0L, the control signal SCS2 is mapped to the control terminal CS0R, the control signal SCS1 is mapped to the control terminal CS1L, the control signal SCS3 is mapped to the control terminal CS1R, the control signal SODT0 is mapped to the control terminal ODTL, the control signal SODT2 is mapped to the control terminal ODTR and the control signals SODT1 and SODT3 are mapped to the control terminals A15L and A15R. The control signals SCS0, . . . , SCS3 can be used to select the respective memory chips in ranks 0, . . . , 3. The control signals SODT0, . . . , SODT3 can be used to activate the respective terminating resistors for the memory chips which are associated with ranks 0, . . . , 3.

Figure 9:
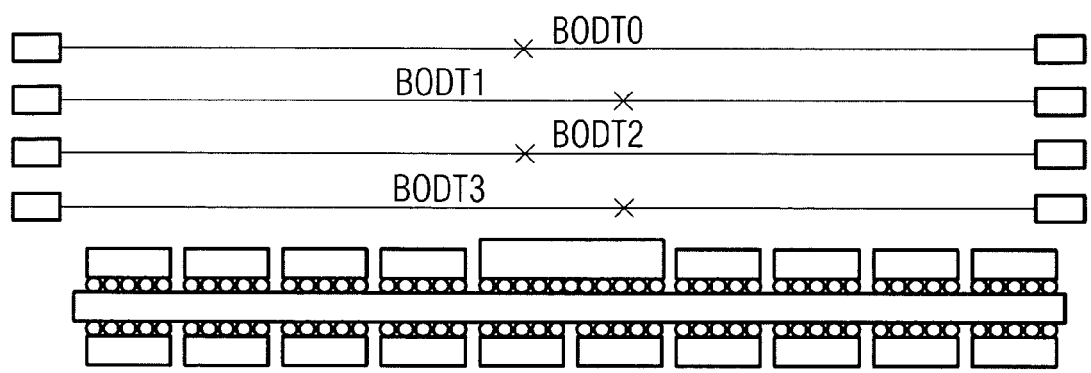
FIG. 9 shows a third arrangement of bus lines for transmitting control signals from a control component to semiconductor memory components of a semiconductor memory module.

FIG. 9 shows the course of the bus line BODT0 connected to the control terminal ODTL, the course of the bus line BODT1 connected to the control terminal A15L, the course of the bus line BODT2 connected to the control terminal ODTR, and the course of the bus line BODT3 connected to the control terminal A15R. All the buses BODT0, BODT1, BODT2 and BODT3 connect semiconductor memory components both on the left-hand and on the right-hand side of the control component and have their ends respectively terminated via a terminating resistor.

With the embodiments of the control component which are indicated in FIGS. 4 to 9, the control component SB can be operated in the 2Rx4, 4Rx4 or 4Rx8 memory configuration without the need to provide additional control terminals for generating control signals for selecting the memory chips in rank 2 and in rank 3 and additional control terminals for generating the control signals for activating the terminating resistors for the memory chips in ranks 2 and 3.

The control signals SCS and SODT are multiplexed exclusively in the control unit CAD and hence within the control component's CA domain. Thereby, the CA domain is isolated from the DQ domain, formed via the data control unit DQD, such that crosstalk is prevented with the DQ domain.

While the device has been described in detail with reference to specific embodiments thereof, it will be apparent to one of ordinary skill in the art that various changes and modifications can be made therein without departing from the spirit and scope thereof. Accordingly, it is intended that the described device covers the modifications and variations of this device provided they come within the scope of the appended claims and their equivalents.

What is claimed is:

1. A control component for controlling a semiconductor memory component in a semiconductor memory module, comprising:
    a control unit for generating control signals for controlling read and write access to the semiconductor memory component and for generating address signals for addressing memory cells in the semiconductor memory component for read and write access;
    a plurality of address terminals for providing the address signals; and
    a selection circuit for supplying one of the address terminals with a selected signal selected between one of the address signals and one of the control signals.

2. The control component as claimed in claim 1,
    wherein the semiconductor memory component comprises a plurality of memory chips; and
    wherein the control unit generates a first of the control signal for selecting one of the memory chips for read and write access.

3. The control component as claimed in claim 2,
    wherein each of the memory chips comprises an activatable terminating resistor that is activated for write access; and
    wherein the control unit generates a second control signal for activating the activatable terminating resistor of said one of the memory chips.

4. The control component as claimed claim 2, further comprising a second selection circuit, wherein the selection circuit supplies one of the address signals and a first of the control signals to a first of the address terminals, and the second selection circuit supplies one of the address signals and a second of the control signals to a second of the address terminals.

5. The control component as claimed in claim 4, further comprising a third selection circuit which supplies a first of the control signals and a second of the control signals to a first of the control terminals.

6. The control component as claimed in claim 5, further comprising a fourth selection circuit which supplies a second of the control terminals with one of a plurality of second control signals for selecting respective different ones of the memory chips for read and write access.

7. The control component as claimed in claim 1, wherein the control unit is supplied with a configuration signal and the selection circuit selects the selected signals based on the configuration signal.

8. The control component as claimed in claim 1, wherein the selection circuit comprises a multiplexer.

9. A semiconductor memory module, comprising:
    a control component as claimed in claim 1;
    a plurality of semiconductor memory components;
    a module board on which the control component and the plurality of semiconductor memory components are arranged such that the plurality of semiconductor memory components are arranged on a left-hand and a right-hand side of the control component; and
    a bus connecting each of the address terminals of the control component to the semiconductor memory components;
    wherein the semiconductor memory components, arranged on the left-hand and right-hand sides of the control component, are connected to the control component via a bus connected to a first of the address terminals.

10. The semiconductor memory module as claimed in claim 9, further comprising:
    a bus connecting each of the control terminals of the control component to the semiconductor memory components;
    wherein the semiconductor memory components arranged on left-hand and right-hand sides of the control component, are connected to the control component via a bus connected to a second of the control terminals.

11. The semiconductor memory module as claimed in claim 9,
    wherein a terminating resistor is arranged at a respective end of the buses.

12. The semiconductor memory module as claimed in claim 9, further comprising:
    a memory circuit for storing a configuration state based on ranks arranged on the semiconductor memory module;
    wherein the control circuit controls the selection circuit based on the configuration state stored in the memory circuit, such that one of the signals supplied to the selection circuit is selected.

13. The semiconductor memory module as claimed in claim 12,
    wherein the memory circuit is an electrically programmable memory.

14. The semiconductor memory module as claimed in claim 9,
    wherein the semiconductor memory components are operated in a 4Rx4 or 4Rx8 module configuration.

15. A method for operating a semiconductor memory module, comprising:
    providing a semiconductor memory module as claimed in claim 9;
    operating the semiconductor memory module in a first configuration when the semiconductor memory module includes a first number of ranks, and operating the semiconductor memory module in a second configuration when the semiconductor memory module includes a second number of ranks; and
    generating one of the control signals controlling read and write access to the semiconductor memory component at one of the address terminals of the control component in the semiconductor memory module when the semiconductor memory module is operated in the first configuration, and generating one of: the address signals, a floating potential and a reference potential at one of the address terminals when the semiconductor memory module is operated in the second configuration.

16. The method as claimed in claim 15, further comprising:

generating the first control signal, for selecting a memory chip in a semiconductor memory component for read or write access, at the first address terminal of the control component in the semiconductor memory module when the semiconductor memory module is operated in the first configuration, and generating one of: a first address signal, the floating potential and the reference potential at the first address terminal when the semiconductor memory module is operated in the second configuration; and generating the second control signal at the second address terminal when the semiconductor memory module is operated in the first configuration, and generating one of: a second address signal, the floating potential and the reference potential at the second address terminal when the semiconductor memory module is operated in the second configuration.

17. The method as claimed in claim 15, comprising:

operating the semiconductor memory module in a first configuration in the event that the semiconductor memory module comprises a first number of ranks, and operating the semiconductor memory module in a second configuration in the event that the semiconductor memory module comprises a second number of ranks;

generating the first control signal at the first address terminal when the semiconductor memory module is operated in the first configuration, and generating one of: a first address signal, a floating potential and a reference potential at the first address terminal in the event that the semiconductor memory module is operated in the second configuration; and generating the second control signal at the first control terminal in the event that the semiconductor memory module is operated in the first configuration, and generating the first control signal at the first control terminal in the event that the semiconductor memory module is operated in the second configuration.

18. The method as claimed in claim 15, further comprising:

ascertaining the number of ranks on the semiconductor memory module via evaluating a memory state of the memory circuit, the memory state identifying the number of ranks on the semiconductor memory module.

19. The method as claimed in claim 15, wherein the semiconductor memory module is operated in the first configuration in the event that the semiconductor memory module includes a number of four ranks;

wherein the semiconductor memory module is operated in the second configuration when the semiconductor memory module includes a number of two ranks.

* * * * *